US010763886B1

(12) United States Patent
Narayan et al.

(10) Patent No.: US 10,763,886 B1
(45) Date of Patent: Sep. 1, 2020

(54) DITHERING AND CALIBRATION TECHNIQUE IN MULTI-STAGE ADC

(71) Applicant: TEXAS INSTRUMENTS INCORPORATED, Dallas, TX (US)

(72) Inventors: Subramanian Jagdish Narayan, Bengaluru (IN); Chandana Krishna, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/545,058

(22) Filed: Aug. 20, 2019

(51) Int. Cl.
*H03M 3/00* (2006.01)
*H03M 1/68* (2006.01)
*H03M 1/16* (2006.01)
*H03M 1/44* (2006.01)

(52) U.S. Cl.
CPC .......... *H03M 3/3287* (2019.05); *H03M 1/164* (2013.01); *H03M 1/44* (2013.01); *H03M 1/687* (2013.01)

(58) Field of Classification Search
CPC ...... H03M 3/3287; H03M 1/687; H03M 1/42; H03M 1/44; H03M 3/33; H03M 1/164
USPC .......................... 341/120, 131, 156, 161–163
See application file for complete search history.

(56) References Cited

U.S. PATENT DOCUMENTS

| 5,990,815 A * | 11/1999 | Linder | H03M 1/0641 341/131 |
| 7,786,910 B2 * | 8/2010 | Ali | H03M 1/0673 341/118 |
| 9,059,730 B2 * | 6/2015 | Park | H03M 1/145 |

\* cited by examiner

*Primary Examiner* — Khai M Nguyen
(74) *Attorney, Agent, or Firm* — John R. Pessetto; Charles A. Brill; Frank D. Cimino

(57) ABSTRACT

A multi-stage analog-to-digital converter includes a signal input terminal, a first stage analog-to-digital converter, a digital-to-analog converter; a second stage analog-to-digital converter, and dither circuitry. The first stage analog-to-digital converter includes an input coupled to the signal input terminal. The digital-to-analog converter includes an input coupled to an output of the first stage analog-to-digital converter, and an input coupled to the signal input terminal. The second stage analog-to-digital converter includes a first input coupled to an output of the digital-to-analog converter. The dither circuitry is coupled to a second input of the second stage analog-to-digital converter, and is configured to provide a dither signal to the second stage analog-to-digital converter during selection of fewer than all bits of a digital value of a residue signal received from the digital-to-analog converter.

20 Claims, 3 Drawing Sheets

DITHERING AND CALIBRATION TECHNIQUE IN MULTI-STAGE ADC

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten-bit resolution only ten iterations are required, and for twenty bits of resolution only twenty iterations are required.

SUMMARY

A multi-stage successive approximation register analog-to-digital converter that provides on the fly operation and no missing codes is disclosed herein. In one example, a multi-stage analog-to-digital converter includes a signal input terminal, a first stage analog-to-digital converter, a digital-to-analog converter; a second stage analog-to-digital converter, and dither circuitry. The first stage analog-to-digital converter includes an input coupled to the signal input terminal. The digital-to-analog converter includes an input coupled to an output of the first stage analog-to-digital converter, and an input coupled to the signal input terminal. The second stage analog-to-digital converter includes a first input coupled to an output of the digital-to-analog converter. The dither circuitry is coupled to a second input of the second stage analog-to-digital converter, and is configured to provide a dither signal to the second stage analog-to-digital converter during selection of fewer than all bits of a digital value of a residue signal received from the digital-to-analog converter.

In another example, a multi-stage analog-to-digital converter includes a first stage analog-to-digital converter, a main digital-to-analog converter, a second stage analog-to-digital converter, and dither circuitry. The first stage analog-to-digital converter is configured to generate a plurality of most significant bits of a digital value corresponding to an input signal. The main digital-to-analog converter is coupled to the first stage analog-to-digital converter, and is configured to generate a residue signal as a difference of the input signal and a voltage corresponding to the most significant bits of the digital value. The second stage analog-to-digital converter is coupled to the main digital-to-analog converter (through a Residue amplifier) and is configured to generate a plurality of least significant bits of the digital value based on the (amplified) residue signal. The dither circuitry is coupled to the second stage analog-to-digital converter, and is configured to provide a dither signal to the second stage analog-to-digital converter during selection of at least one and fewer than all of the least significant bits.

In a further example, a method for analog-to-digital conversion includes generating, by a first analog-to-digital converter, a plurality of most significant bits of a digital value corresponding to an input signal. A residue signal corresponding to a difference of the input signal and an analog signal corresponding to the most significant bits of the digital value generated by the first stage analog-to-digital converter is generated by a main digital-to-analog converter. A plurality of least significant bits of the digital value corresponding to an input signal is generated by a second analog-to-digital converter based on the residue signal (e.g., an amplified version of the residue signal). A dither signal is provided to the second stage analog-to-digital converter during selection of at least one and fewer than all of the least significant bits of the digital value.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

In successive approximation register (SAR) analog-to-digital converters (ADCs), missing codes may be caused by static errors or dynamic errors. Mismatch of the capacitors of a capacitive digital-to-analog converter (CDAC) in the SAR ADC lead to the static errors while dynamic errors are caused by settling errors in the CDAC and/or comparator/ amplifier circuitry of the SAR ADC. The capacitor mismatches can be trimmed to avoid missing codes in the ADC. A digital technique for trimming the capacitor mismatches applies a trim code to the ADC output value when conversion of all bits is complete. Dither is another technique used to correct the differential non-linearity artifacts in the ADC and ensure no missing codes. Dither may be implemented by sampling a pseudo-random dither signal along with the input signal and deducting the dither signal from the final ADC output in the digital domain. Again, subtraction of the dither signal from the ADC output is performed after conversion is complete. Thus, both digital trimming of capacitor mismatch and compensation for dither add latency to the SAR ADC. In some applications, receipt of ADC output with minimum delay is preferable. For example, receipt of more significant bits while conversion of bits of lower significance is ongoing is desirable. ADCs that make data bits available prior to the completion of conversion are referred to as "on the fly" SAR ADCs.

The SAR ADCs disclosed herein provide correction for CDAC capacitor mismatch and apply dither to ensure no missing codes while also providing output of data bits on the fly. The SAR ADCs of the present disclosure perform analog-to-digital conversion using multiple conversion stages. In the second conversion stage, dither is applied to selected bit decisions that are most likely to be subject to mismatch errors. The dither has little effect on the signal-to-noise ratio of the SAR ADC, and no compensation for the dither is applied. Bits of the digital signal value generated by the first conversion stage are available for output after generation of a first bit in the second conversion stage. Thus, the SAR ADCs provide on the fly operation.

Figure 1:
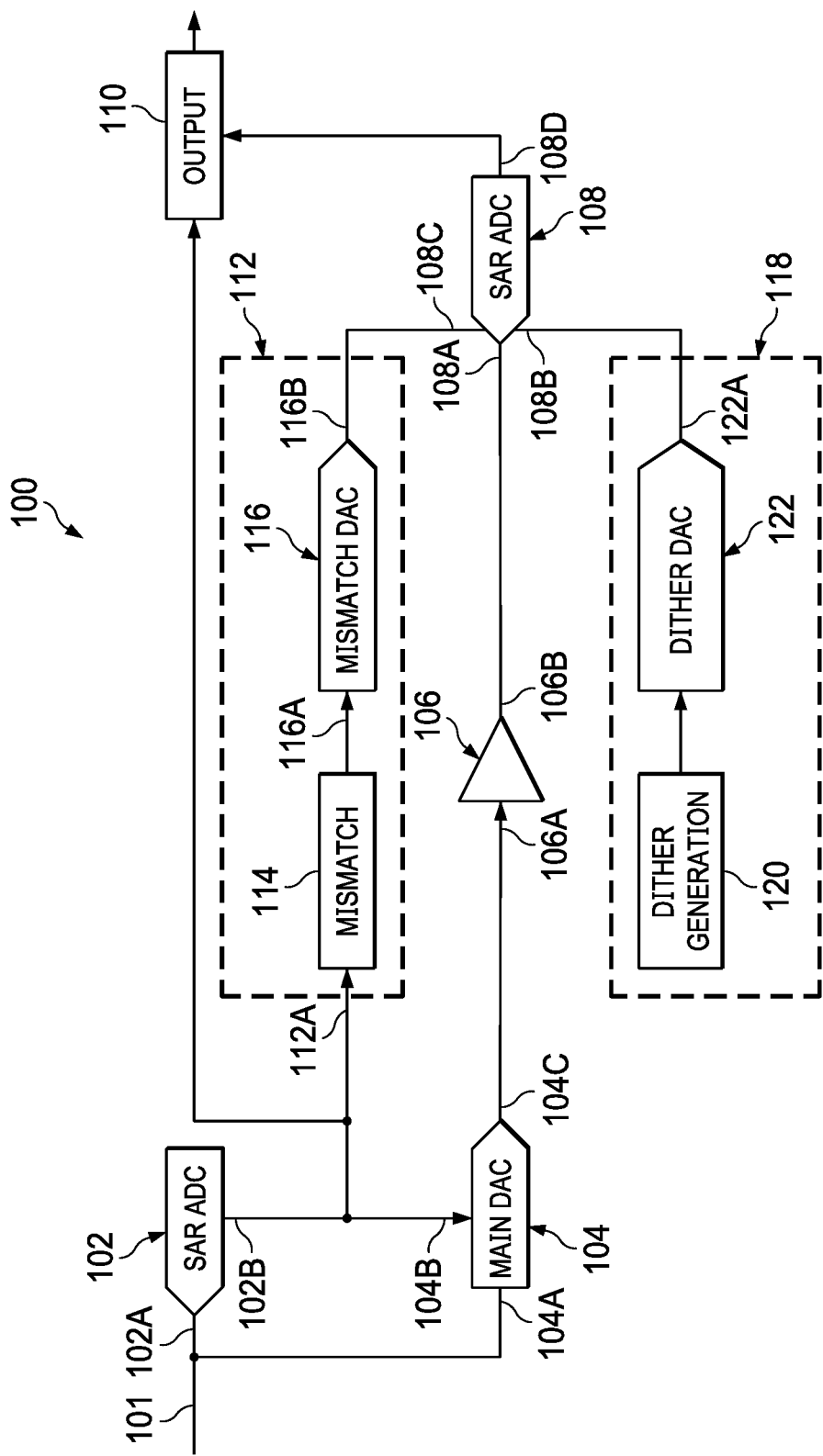
FIG. 1 shows a block diagram for a multi-stage successive approximation register (SAR) analog-to-digital converter (ADC) in accordance with this description.

FIG. 1 shows a block diagram for a multi-stage successive approximation register (SAR) analog-to-digital converter (ADC) 100 in accordance with this description. The multi-stage SAR ADC 100 includes a first stage SAR ADC 102, a main digital-to-analog converter (DAC) 104, an amplifier 106, a second stage SAR ADC 108, output circuitry 110, correction circuitry 112, and dither circuitry 118. The multi-stage SAR ADC 100 generates an M-bit digital output representing an analog signal received at the signal input terminal 101. The first stage SAR ADC 102 generates a predetermined number of the most significant of the M bits, and the second stage SAR ADC 108 generates the remainder of the M-bits. For example, in an implementation of the multi-stage SAR ADC 100 that generates a 16-bit output, the first stage SAR ADC 102 generates the 6 most significant bits (with 1 or more additional redundant bits), and the second stage SAR ADC 108 generates the 10 least significant bits of the 16 bits. The output circuitry 110 receives the digital values generated by the first stage SAR ADC 102 and the second stage SAR ADC 108, and combines (e.g., concatenates) the digital values to produce a digital output value. The multi-stage architecture allows for a reduction in the size of the capacitors used in the first stage SAR ADC 102 and the second stage SAR ADC 108.

The first stage SAR ADC 102 includes an input 102A coupled a signal input terminal 101 of the multi-stage SAR ADC 100. Similarly, the main DAC 104 includes an input 104A coupled to the signal input terminal 101. In the multi-stage SAR ADC 100, digitization starts with the first stage SAR ADC 102 and main DAC 104 sampling the analog signal provided at the signal input terminal 101. The main DAC 104 is a CDAC, and the analog signal is sampled onto the capacitors of the main DAC 104. The first stage SAR ADC 102 also includes a CDAC onto which the analog signal is sampled. The first stage SAR ADC 102 digitizes the sampled analog signal to produce the bits of higher significance of the output value of the multi-stage SAR ADC 100, and provides the digital value to the main DAC 104. The main DAC 104 includes an input 104B that is coupled to the output 102B of the first stage SAR ADC 102. The main DAC 104 subtracts voltage corresponding to the digital value received from the first stage SAR ADC 102 from the sampled analog signal to produce a signal (a residue signal) corresponding to the portion of the sampled analog signal not represented by the digital value received from the first stage SAR ADC 102. That is the residue signal produced by the main DAC 104 represents the quantization error of the first stage SAR ADC 102.

The residue signal produced by the main DAC 104 is amplified by the amplifier 106 to generate a signal suitable for digitization by the second stage SAR ADC 108. The amplifier 106 includes an input 106A coupled to an output 104C of the main DAC 104, and an output 1066 coupled to an input 108A of the second stage SAR ADC 108.

The second stage SAR ADC 108 includes a CDAC. The signal provided by the amplifier 106 is sampled onto the capacitors of the CDAC, and the second stage SAR ADC 108 digitizes the sampled residue signal to produce the bits of lower significance of the digital output value of the multi-stage SAR ADC 100.

The output circuitry 110 combines the bits generated by the first stage SAR ADC 102 and the bits generated by the second stage SAR ADC 108 to produce the digital output value of the multi-stage SAR ADC 100. The output circuitry 110 is coupled to the output 102B of the first stage SAR ADC 102 and the output 108D of the second stage SAR ADC 108. For example, if the first stage SAR ADC 102 generates m bits, where 1 of the m bits is redundant, then an implementation of the output circuitry 110 produces the digital output value of the multi-stage SAR ADC 100 by concatenation as:

$$\frac{\begin{array}{c} D_{10}D_{11} \ldots D_{1m} + \\ D_{20}D_{21} \ldots D_{2k} \end{array}}{D_0 D_1 \ldots D_m D_{m+1} \ldots D_{m+k-2}}$$

Similarly, if the first stage SAR ADC 102 generates m bits, where 2 of the m bits are redundant, then an implementation of the output circuitry 110 produces the digital output value of the multi-stage SAR ADC 100 by concatenation as:

$$\frac{\begin{array}{c} D_{10}D_{11} \ldots D_{1m-1}D_{1m} + \\ D_{20}D_{21}D_{22} \ldots D_{2k} \end{array}}{D_0 D_1 \ldots D_{m-1}D_m D_{m+1} \ldots D_{m+k-3}}$$

Mismatches in the capacitors of the main DAC 104 can cause missing codes in the multi-stage SAR ADC 100. To avoid missing codes caused by mismatch of the capacitors of the main DAC 104, the correction circuitry 112 generates a signal applied in the second stage SAR ADC 108 to compensate for the mismatch. The correction circuitry 112 includes an input 112A coupled to the output 1026 of the first stage SAR ADC 102, mismatch circuitry 114 and a mismatch DAC 116. The mismatch circuitry 114 receives the bits generated by the first stage SAR ADC 102 (i.e., the bits provided to the main DAC 104), where the bits identify the capacitors applied in the main DAC 104. The mismatch of the capacitors of the main DAC 104 and/or compensation for the mismatch in each capacitor is stored in the mismatch circuitry 114. Based on the bits generated by the first stage SAR ADC 102 and the stored mismatch values, the mismatch circuitry 114 determines and generates a correction value for correcting the mismatch. The mismatch circuitry 114 generates the correction signal in the time interval during which the amplifier 106 amplifies the residue signal.

The mismatch DAC 116 includes an input 116A that is coupled to the mismatch circuitry 114. The mismatch DAC 116 receives the correction value generated by the mismatch circuitry 114 and converts the correction value to a mismatch correction signal. An output 116B of the mismatch DAC 116 is coupled to an input 108C of the second stage SAR ADC 108. The second stage SAR ADC 108 digitizes the correction signal in conjunction with the amplified residue signal. For example, the signal sampled by the second stage SAR ADC 108 for digitization is a sum of the correction signal and the amplified residue signal in some implementations of the second stage SAR ADC 108. Compensating for capacitor mismatch in the second stage SAR ADC 108 enables the multi-stage SAR ADC 100 to provide on the fly operation.

In a SAR ADC, the effect of mismatch is greatest for the MSB bits and the effects of mismatch decrease exponentially with successively lower bits. In the binary search algorithm applied by the second stage SAR ADC 108, the critical decision on the MSB capacitor is determined only once out of the $2^n$ decisions, the critical decision of the MSB-1 is determined twice on $2^n$ decisions and so on. In the multi-stage SAR ADC 100, dither is applied only when determining the values of selected MSBs of the second stage SAR ADC 108. If the dither is applied only to selected MSB bits, noise added to the converted signal by the dither is very small as it is applied to very few critical decisions. This ensures that the SNR effect is very minimal even if there is no digital compensation at the end of the conversion.

The dither circuitry 118 is coupled to an input 108B of the second stage SAR ADC 108 and generates a dither signal that is applied in the second stage SAR ADC 108 during conversion of the selected MSBs of the second stage SAR ADC 108. When conversion of the selected MSBs is complete, the dither signal is disabled and not applied during conversion of the remaining bits. Thus, the second stage SAR ADC 108 applies the dither signal during selection of some, but not all bits, of the value generated by digitizing the residue signal. The dither circuitry 118 includes dither generation circuitry 120 and a dither DAC 122 coupled to the dither generation circuitry 120. An output 122A of the dither DAC 122 is coupled to an input 108B of the second stage SAR ADC 108. The dither generation circuitry 120 generates a random or pseudo-random dither value for each residue signal sample digitized by the second stage SAR ADC 108. The dither value represents a fraction of a least significant bit of the second stage SAR ADC 108 in some implementations. The dither DAC 122 converts the dither value generated by the dither generation circuitry 120 to a dither signal that is added to the residue signal during conversion of the selected MSBs. When conversion of the selected MSBs is complete, the dither signal is disabled, and is not added to the residue signal for selection of the remainder of the bits. For example, if the SAR ADC 108 digitizes to 10-bit resolution, then the dither signal is applied to selection of three most significant of the 10 bits, and not applied to selection of the seven bits of lower significance.

Under such conditions, the SNR effect is limited to 7 critical decisions of the total of 1024 possible decisions limiting the effect of the SNR.

Figure 2:
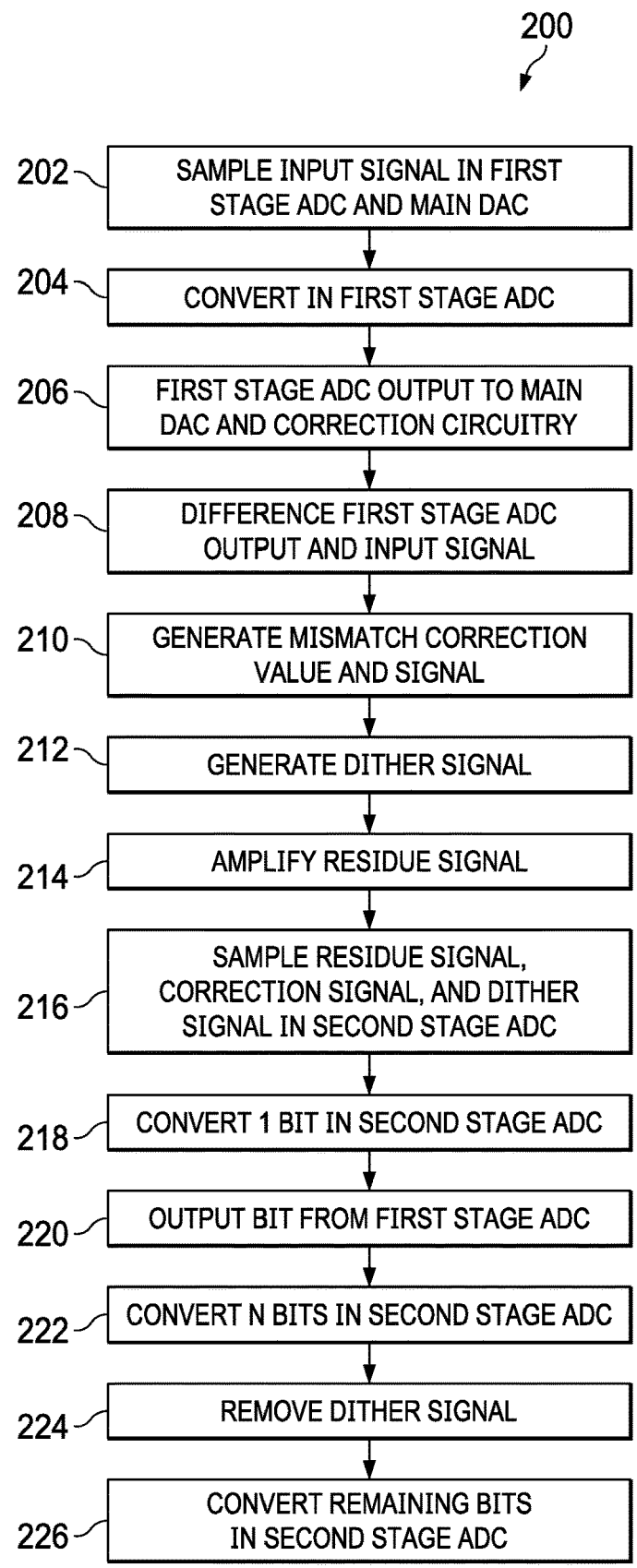
FIG. 2 shows a flow diagram for a method for analog-to-digital conversion in accordance with this description.

FIG. 2 shows a flow diagram for a method 200 for analog-to-digital conversion in accordance with this description. Though depicted sequentially as a matter of convenience, at least some of the actions shown can be performed in a different order and/or performed in parallel. Additionally, some implementations may perform only some of the actions shown. Operations of the method 200 are performed by implementations of the multi-stage SAR ADC 100.

In block 202, the first stage SAR ADC 102 and the main DAC 104 sample the analog input signal provided at the signal input terminal 101. That is, the voltage of the input signal is stored on the capacitors of a CDAC of the first stage SAR ADC 102, and on the capacitors of main DAC 104, which is a CDAC.

In block 204, the first stage SAR ADC 102 converts the sample of the analog signal to a digital value. The digital value generated by the first stage SAR ADC 102 includes the most significant bits of the digital value to be output by the multi-stage SAR ADC 100.

In block 206, the first stage SAR ADC 102 provides the digital value generated in block 204 to the main DAC 104 and the correction circuitry 112.

In block 208, the main DAC 104 generates an output (a residue signal) that is the difference of the sample of the analog input signal acquired in block 202 and an analog voltage corresponding to the digital value generated by the first stage SAR ADC 102 in block 204.

In block 210, the correction circuitry 112 generates a mismatch correction value and a mismatch correction signal based on the digital value generated by the first stage SAR ADC 102. The correction circuitry 112 uses the digital value to identify the capacitors of the main DAC 104 applied to generate the residue signal. The mismatch correction value and the mismatch correction signal compensate for mismatch in the capacitors used in the main DAC 104 to produce the residue signal in block 208. The correction circuitry 112 provides the correction signal which is applied to the second stage SAR ADC 108.

In block 212, the dither circuitry 118 generates a dither signal. The dither signal adds noise to the conversion of selected MSBs of the residue signal in the second stage SAR ADC 108. The noise randomizes the thresholds applied in the second stage SAR ADC 108 and aids in no missing code operation.

In block 214, the amplifier 106 amplifies (applies gain to) the residue signal generated in block 208, and provides the amplified residue signal to the second stage SAR ADC 108.

In block 216, the second stage SAR ADC 108 samples the amplified residue signal and the correction signal. The dither is added to the sampled signals for conversion of selected MSBs.

In block 218, the second stage SAR ADC 108 converts a first bit (i.e., determines a value of the MSB) of the digital value corresponding to the amplified residue signal, the correction signal, and the dither signal.

In block 220, responsive to selection of the MSB by the second stage SAR ADC 108 in block 218, the output circuitry 110 outputs the first bit of the digital value corresponding to the analog signal sampled in block 202.

In block 222, the second stage SAR ADC 108 selects the values of any addition MSBs to which dither is to be applied.

In block 224, the dither signal is removed from the second stage SAR ADC 108.

In block 226, the values of all remaining bits (e.g., LSBs) of the digital value corresponding to the amplified residue signal and the correction signal are selected in the second stage SAR ADC 108 with no dither applied.

Figure 3:
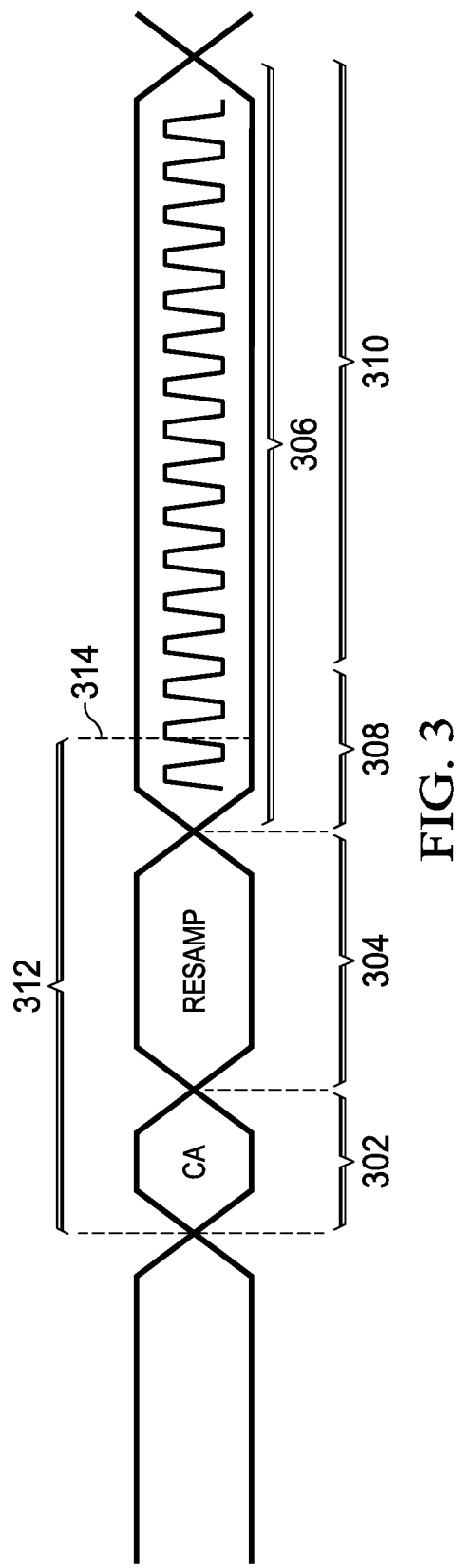
FIG. 3 shows a timing diagram for operation of a SAR ADC in accordance with this description.

FIG. 3 shows a timing diagram for operation of a SAR ADC in accordance with this description. In interval 302, the first stage SAR ADC 102 digitizes the sampled input signal. In interval 304, the main DAC 104 subtracts an analog value corresponding to the digital value produced by the first stage SAR ADC 102 from the sampled input signal to produce a residue signal, and the amplifier 106 amplifies the residue signal. Also, in interval 304, the correction circuitry 112 generates a mismatch correction signal based on the digital value produced by the first stage SAR ADC 102, and the dither circuitry 118 generates a dither signal.

In interval 306, the second stage SAR ADC 108 digitizes the residue signal and the correction signal. In the interval 308, the dither signal is applied to the second stage SAR ADC 108 in conjunction with the amplified residue signal and the correction signal to randomize the thresholds for selection of a predetermined number of MSBs.

In interval 310, the dither signal is removed from the second stage SAR ADC 108, and values of the remaining bits are selected without dither.

The interval 312 defines latency of the multi-stage SAR ADC 100, indicating that a first bit generated by the first stage SAR ADC 102 is output by the output circuitry 110 when the second stage SAR ADC 108 has selected the value of its MSB. Thus, the multi-stage SAR ADC 100 outputs bit values of the digitized signal while conversion is ongoing to provide on the fly operation.

Modifications are possible in the described embodiments, and other embodiments are possible, within the scope of the claims.

What is claimed is:

1. A multi-stage analog-to-digital converter, comprising:
   a signal input terminal;
   a first stage analog-to-digital converter comprising an input coupled to the signal input terminal;
   a digital-to-analog converter comprising:
     an input coupled to an output of the first stage analog-to-digital converter; and
     an input coupled to the signal input terminal;
   a second stage analog-to-digital converter comprising a first input coupled to an output of the digital-to-analog converter; and
   dither circuitry coupled to a second input of the second stage analog-to-digital converter, and configured to provide a dither signal to the second stage analog-to-digital converter during selection of fewer than all bits of a digital value of a residue signal received from the digital-to-analog converter.

2. The multi-stage analog-to-digital converter of claim 1, wherein the dither circuitry is configured to:
   provide the dither signal to the second stage analog-to-digital converter during selection of a predetermined number of most significant bits of the digital value; and
   not provide the dither signal to the second stage analog-to-digital converter during selection of bits having significance lower than the predetermined number of most significant bits.

3. The multi-stage analog-to-digital converter of claim 1, further comprising:
   an amplifier comprising:
     an input coupled to the output of the digital-to-analog converter; and
     an output coupled to first input of the second stage analog-to-digital converter.

4. The multi-stage analog-to-digital converter of claim 1, wherein:
   the digital-to-analog converter is a first digital-to-analog converter; and
   the dither circuitry comprises a second digital-to-analog converter comprising an output coupled to the second input of the second stage analog-to-digital converter.

5. The multi-stage analog-to-digital converter of claim 1, further comprising correction circuitry comprising:
   an input coupled to the first stage analog-to-digital converter; and
   mismatch circuitry configured to generate a value for correcting capacitor mismatch in the digital-to-analog converter based on a digital value received from the first stage analog-to-digital converter.

6. The multi-stage analog-to-digital converter of claim 5, wherein:
   the digital-to-analog converter is a first digital-to-analog converter; and
   the correction circuitry comprises a second digital-to-analog converter comprising:
     an input coupled to an output of the mismatch circuitry; and
     an output coupled to a third input of the first digital-to-analog converter.

7. The multi-stage analog-to-digital converter of claim 1, further comprising output circuitry coupled to the output of the first stage analog-to-digital converter, and an output of the second stage analog-to-digital converter, and configured to generate an output value of the multi-stage analog-to-digital converter by combining a digital value generated by the first stage analog-to-digital converter and a digital value generated by the second stage analog-to-digital converter.

8. The multi-stage analog-to-digital converter of claim 7, wherein the output circuitry is configured to output a most significant bit of the output value responsive to determination of a first bit value by the second stage analog-to-digital converter.

9. A multi-stage analog-to-digital converter, comprising:
   a first stage analog-to-digital converter configured to generate a plurality of most significant bits of a digital value corresponding to an input signal;
   a main digital-to-analog converter coupled to the first stage analog-to-digital converter, and configured to generate a residue signal corresponding to a difference of the input signal and an analog signal corresponding to the most significant bits of the digital value;
   a second stage analog-to-digital converter coupled to the main digital-to-analog converter and configured to generate a plurality of least significant bits of the digital value based on the residue signal; and
   dither circuitry coupled to the second stage analog-to-digital converter, and configured to provide a dither signal to the second stage analog-to-digital converter during selection of at least one and fewer than all of the least significant bits.

10. The multi-stage analog-to-digital converter of claim 9, wherein the dither circuitry is configured to:
   provide the dither signal to the second stage analog-to-digital converter during selection of a predetermined number of most significant bits of the second stage analog-to-digital converter; and
   not provide the dither signal to the second stage analog-to-digital converter during selection of bits having significance lower than the predetermined number of most significant bits of the second stage analog-to-digital converter.

11. The multi-stage analog-to-digital converter of claim 9, further comprising an amplifier configured to apply gain to the residue signal and provide an amplified residue signal to the second stage analog-to-digital converter for digitization.

12. The multi-stage analog-to-digital converter of claim 9, wherein the dither circuitry comprises a dither digital-to-analog converter coupled to the second stage analog-to-digital converter and configured to generate the dither signal.

13. The multi-stage analog-to-digital converter of claim 9, further comprising correction circuit configured to generate, based on the most significant bits of the digital value, a correction value for correcting capacitor mismatch in the main digital-to-analog converter.

14. The multi-stage analog-to-digital converter of claim 13, wherein the correction circuit further comprises a mismatch digital-to-analog converter configured to:
generate, based on the correction value, a correction signal; and
provide the correction signal to the second stage analog-to-digital converter.

15. The multi-stage analog-to-digital converter of claim 9, further comprising output circuitry configured to generate an output value of the multi-stage analog-to-digital converter by combining the most significant bits of the digital value generated by the first stage analog-to-digital converter and the least significant bits of the digital value generated by the second stage analog-to-digital converter.

16. The multi-stage analog-to-digital converter of claim 15, wherein the output circuitry is configured to output a most significant bit of the digital value responsive to determination of a first bit value by the second stage analog-to-digital converter.

17. A method for analog-to-digital conversion, comprising:
generating, by a first analog-to-digital converter, a plurality of most significant bits of a digital value corresponding to an input signal;
generating, by a main digital-to-analog converter, a residue signal as a difference of the input signal and an analog signal corresponding to the most significant bits of the digital value generated by the first analog-to-digital converter;
generating, by a second analog-to-digital converter, a plurality of least significant bits of the digital value corresponding to the input signal based on the residue signal; and
providing a dither signal to the second analog-to-digital converter during selection of at least one and fewer than all of the least significant bits of the digital value.

18. The method of claim 17, further comprising:
applying gain to the residue signal; and
providing an amplified residue signal to the second analog-to-digital converter for digitization.

19. The method of claim 17, further comprising:
generating, based on the most significant bits of the digital value generated by the first analog-to-digital converter, a correction value for correcting capacitor mismatch in the main digital-to-analog converter;
generating a correction signal based on the correction value; and
providing the correction signal to the second analog-to-digital converter.

20. The method of claim 17, further comprising providing a most significant bit of the digital value for output responsive to determination of a first bit value by the second analog to digital converter.

* * * * *